(12) United States Patent
Hsieh et al.

(10) Patent No.: US 8,605,454 B2
(45) Date of Patent: Dec. 10, 2013

(54) ELECTRONIC DEVICE

(75) Inventors: Chung-Cheng Hsieh, New Taipei (TW); Li-Ping Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 256 days.

(21) Appl. No.: 13/186,668

(22) Filed: Jul. 20, 2011

(65) Prior Publication Data

US 2012/0140425 A1 Jun. 7, 2012

(30) Foreign Application Priority Data

Feb. 6, 2010 (TW) .................................. 99142287

(51) Int. Cl.
*H05K 7/00* (2006.01)

(52) U.S. Cl.
USPC ........... 361/759; 361/704; 361/709; 361/804; 361/807; 361/679.58

(58) Field of Classification Search
USPC ........................... 361/759; 248/221.11, 227.3
See application file for complete search history.

(56) References Cited

U.S. PATENT DOCUMENTS

| | | | | |
|---|---|---|---|---|
| 5,188,324 | A * | 2/1993 | Joseph et al. | 248/222.52 |
| 6,084,774 | A * | 7/2000 | Talbot et al. | 361/704 |
| 6,486,406 | B1 * | 11/2002 | Greco et al. | 174/138 R |
| 2008/0105816 | A1 * | 5/2008 | Liang | 248/680 |
| 2010/0254105 | A1 * | 10/2010 | Lu | 361/759 |

* cited by examiner

*Primary Examiner* — Tuan T Dinh
*Assistant Examiner* — Mukund G Patel
(74) *Attorney, Agent, or Firm* — Altis Law Group, Inc.

(57) ABSTRACT

An electronic device includes a chassis, a circuit board and a fastening member. The chassis includes a bottom plate. The bottom plate defines a through hole and a securing hole. The circuit board is located on the bottom plate in the chassis. A securing member and a positioning member are secured to the circuit board. The positioning member makes contact with the circuit board and the bottom plate, defines a through opening, and includes a latch engaged in the securing hole. The securing member defines a mounting hole and extending in the through opening. The fastening member is locked in the through hole and the mounting hole.

20 Claims, 4 Drawing Sheets

ELECTRONIC DEVICE

BACKGROUND

1. Technical Field

The present disclosure relates to electronic devices, and particularly to a circuit board of an electronic device.

2. Description of Related Art

Usually, a motherboard of an electronic device defines a plurality of first mounting holes, and a bottom plate of the electronic device chassis defines a plurality of second mounting holes. A plurality of screws is locked into the first and second mounting holes, to secure the motherboard to the bottom plate. However, the alignment of the first mounting holes with the plurality of second mounting holes is very time-consuming and inconvenient. Therefore, there is room for improvement.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
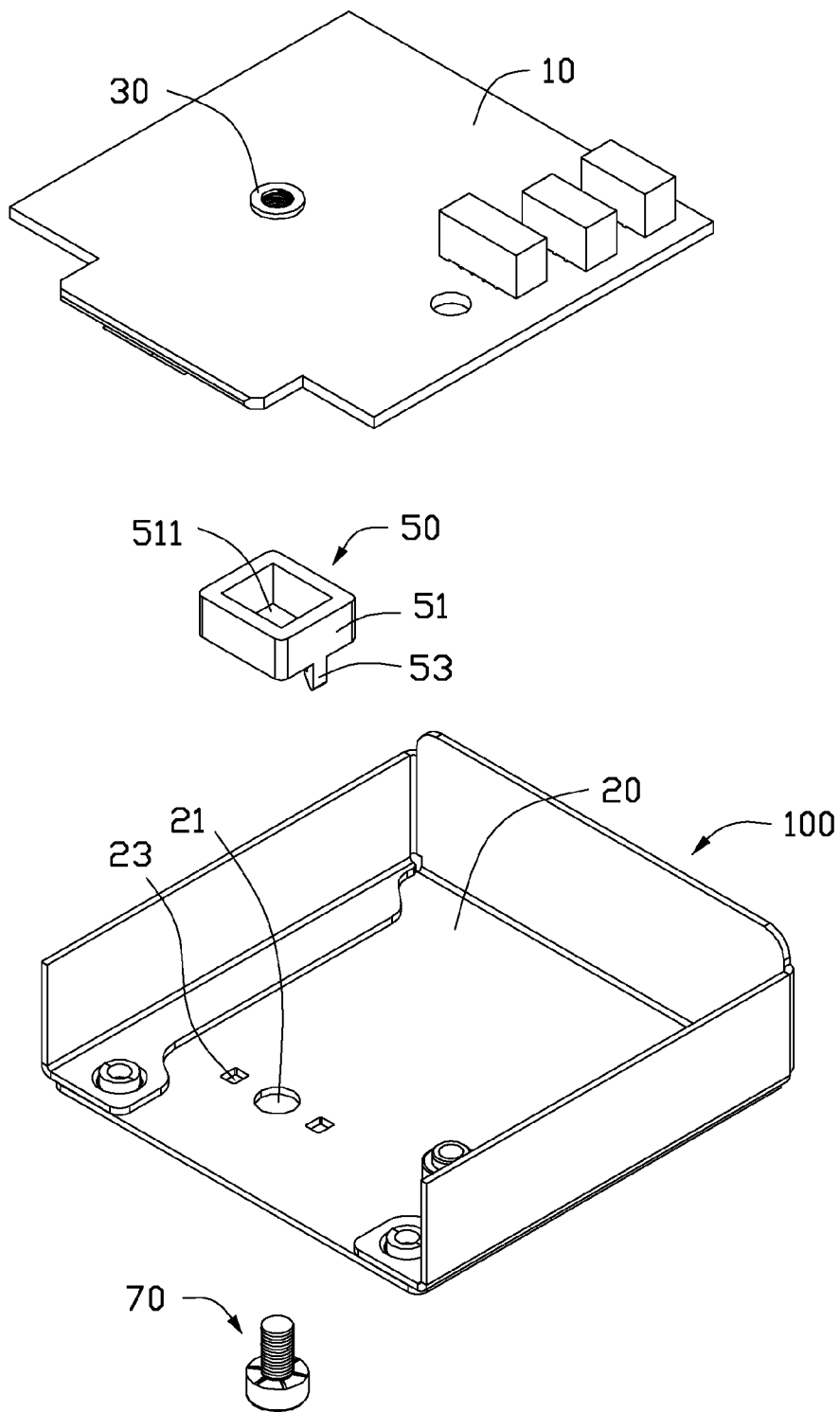
FIG. 1 is an exploded, isometric view of an electronic device in accordance with an embodiment.
Figure 2:
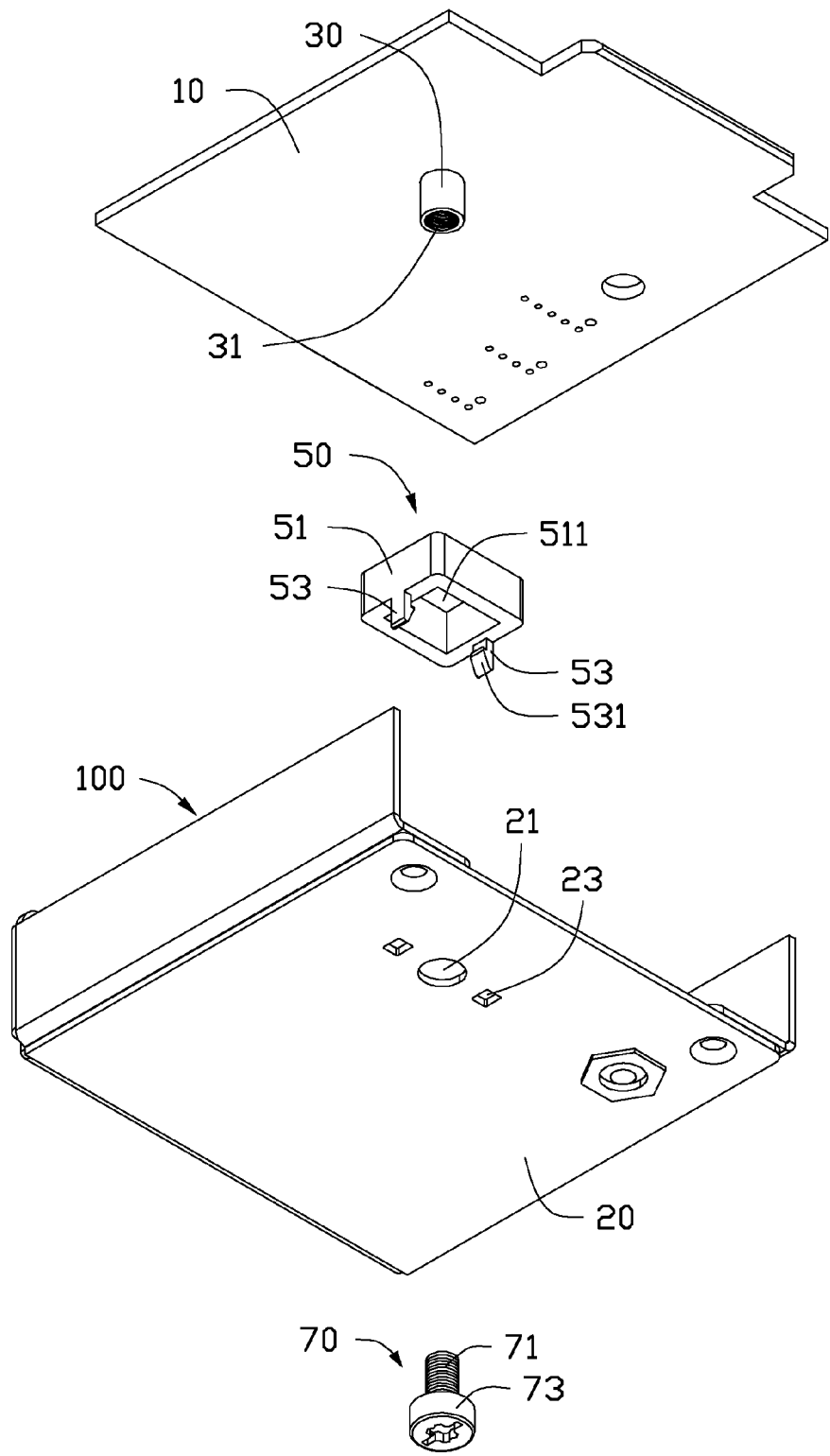
FIG. 2 is similar to FIG. 1, but viewed from a different aspect.

Referring to FIGS. 1-2, an electronic device in accordance with an embodiment includes a chassis 100 and a circuit board 10.

The chassis 100 includes a bottom plate 20. A through hole 21 is defined in the bottom plate 20. Two securing holes 23 are defined in the bottom plate 20. In one embodiment, the two securing holes 23 are located on two opposite sides of the through hole 21. In another embodiment, the through hole 21 is circular, and the two securing holes 23 are rectangular.

A securing member 30 is mounted to the circuit board 10. A mounting hole 31 is defined in the securing member 30. In one embodiment, the mounting hole 31 is a threaded hole. In another embodiment, the securing member 30 is substantially cylindrically shaped.

A positioning member 50 is configured for being attached to the circuit board 10. The positioning member 50 includes a main body 51 and two resiliently deformable latches 53. The main body 51 defines a through opening 511. The two latches 53 are located on a bottom of the main body 51. Each latch 53 includes a hook portion 531 with a slanted surface. The hook portion 531 is located on the distal end of each latch 53. In one embodiment, the two latches 53 are located on two opposite sides of the through opening 511.

Figure 3:
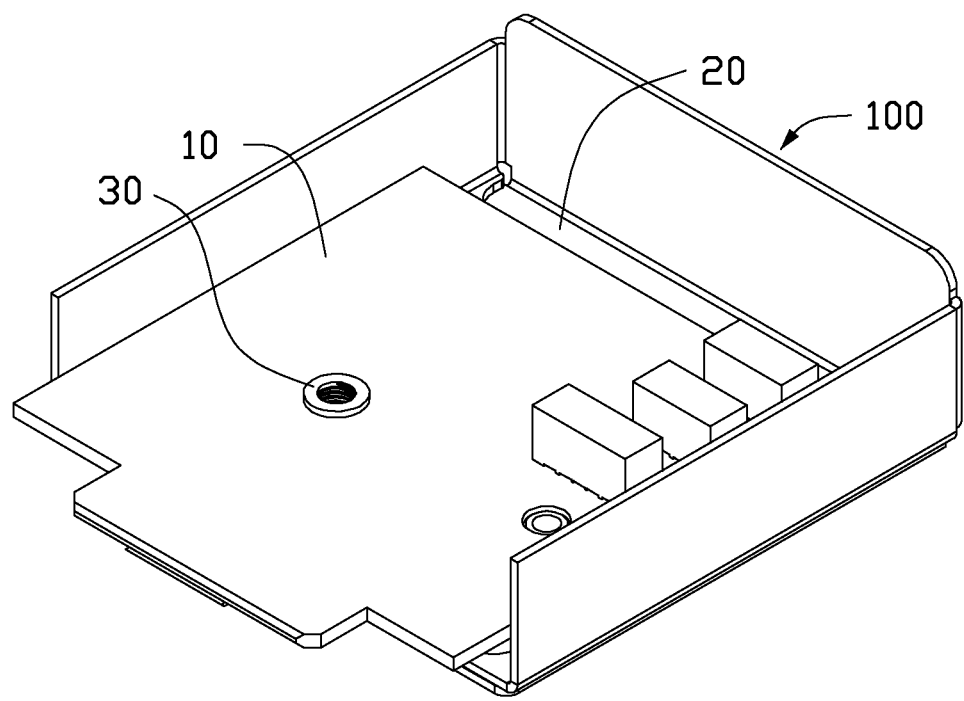
FIG. 3 is an assembled view of FIG. 1.
Figure 4:
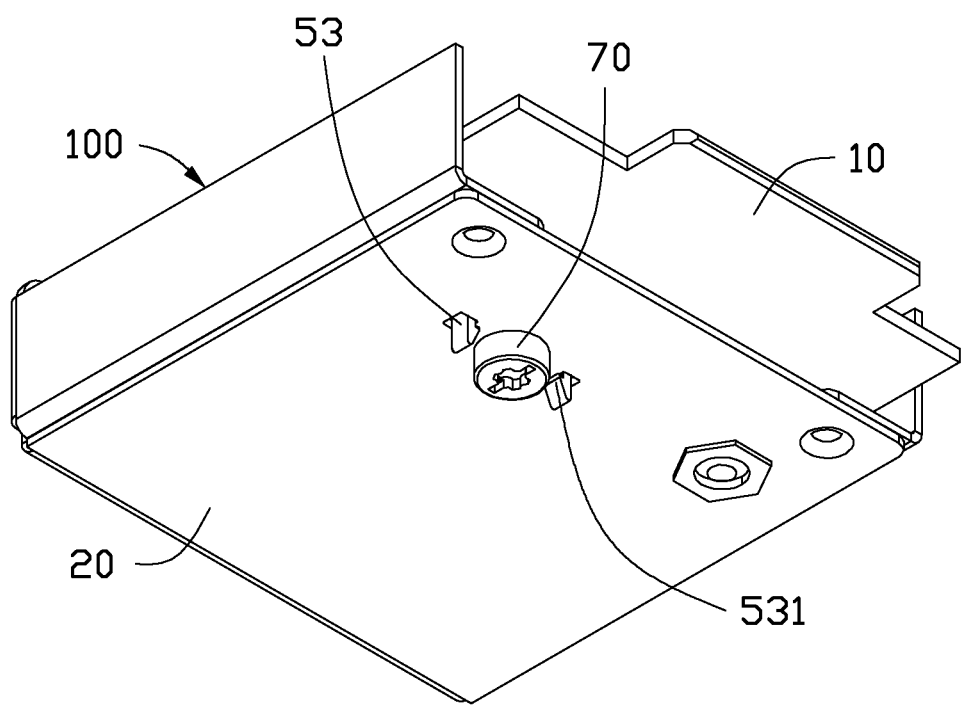
FIG. 4 is an assembled view of FIG. 2.

Referring also to FIGS. 3-4, in assembly, the positioning member 50 is secured to a bottom surface of the circuit board 10. The securing member 30 is inserted into the through opening 511. A top of the main body 51 contacts with a bottom surface of the circuit board 10. In one embodiment, the positioning member 50 is affixed by glue, or soldered, to the circuit board 10.

The circuit board 10 is placed in the chassis 100 on the bottom plate 20. The latches 53 correspond to the securing holes 23 of the bottom plate 20. The circuit board 10 is pushed down to insert the latches 53 into and through the two securing holes 23. The latches 53 are resiliently deformed when the slanted surfaces of the hook portions 531 press against the edges of the securing holes 23. When the hook portions 531 pass through the securing holes 23 to outside of the chassis 100, the latches 53 rebound to engage the hook portions 531 with the edges of the securing holes 23. Therefore, the circuit board 10 is positioned on the bottom plate 20. The mounting hole 31 of the securing member 30 is aligned with the through hole 21 of the bottom plate 20. A fastening member 70, such as a screw, is inserted through the through hole 21 to engage in the mounting hole 31. Thus the circuit board 10 is secured to the bottom plate 20. Part of the bottom plate 20 is sandwiched between, and held in place by, the hook portions 531 and the main body 51.

In one embodiment, the fastening member 70 includes a head portion 73 and a neck portion 71 connecting with the head portion 73. A diameter of the head portion 73 is greater than that of the through hole 21 of the bottom plate 20. A diameter of the neck portion 71 is smaller than that of the through hole 21. The neck portion 71 is externally threaded and is screwed into the mounting hole 31 of the securing member 30.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
a chassis comprising a bottom plate, the bottom plate defining a through hole and two securing holes;
a circuit board located on the bottom plate in the chassis, a securing member and a positioning member secured to the circuit board, the positioning member contacting with the circuit board and the bottom plate, the positioning member defining a through opening and comprising a main body and two latches extending downwards from a bottom surface of the main body; each latch comprising a hook portion, which is engaged in one of the two securing holes, the securing member defining a mounting hole and extending in the through opening; and
a fastening member locked in the through hole and the mounting hole;
wherein each latch is elastically deformable, and the bottom plate is sandwiched between the bottom surface of the main body and the hook portions of the two latches.

2. The electronic device of claim 1, wherein the fastening member comprises a head portion and a neck portion connected to the head portion, the neck portion is locked in the mounting hole of the securing member, and the bottom plate is located between the circuit board and the main body of the positioning member.

3. The electronic device of claim 2, wherein a diameter of the head portion is greater than that of the through hole of the bottom plate, and a diameter of the neck portion is smaller than that of the through hole.

4. The electronic device of claim 1, wherein a top surface of the main body of the positioning member, which is opposite to the bottom surface of the main body, is affixed to the circuit board by glue or by solder.

5. The electronic device of claim 1, wherein the main body is located between the circuit board and the bottom plate.

6. The electronic device of claim 1, wherein the main body comprises two opposite side surfaces, and a distance between the hook portions of the two latches is smaller than a distance between the two opposite side surfaces.

7. The electronic device of claim 6, wherein the hook portions of the two latches extend towards each other and are located between the two opposite side surfaces.

8. An electronic device comprising:
a chassis comprising a bottom plate, the bottom plate defining a through hole and two securing holes;
a circuit board located on the bottom plate in the chassis, a securing member and a positioning member secured to the circuit board, the positioning member located on the circuit board and supporting the circuit board, the positioning member defining a through opening and comprising two latches engaged in the two securing holes, the securing member defining a mounting hole; and
a fastening member extending through the through hole and the through opening to engage in the mounting hole;
wherein the two latches are elastically deformable towards each other to disengage from the two securing holes.

9. The electronic device of claim 8, wherein the positioning member further comprises a main body, each latch extends downwards from a bottom surface of the main body and comprises a hook portion, and the bottom plate is sandwiched between the bottom surface of the main body and the hook portion.

10. The electronic device of claim 9, wherein the fastening member comprises a head portion and a neck portion connected to the head portion, the neck portion is locked in the mounting hole of the securing member, and the bottom plate is located between the circuit board and the main body of the positioning member.

11. The electronic device of claim 10, wherein a diameter of the head portion is greater than that of the through hole of the bottom plate, and a diameter of the neck portion is smaller than that of the through hole.

12. The electronic device of claim 9, wherein the main body of the positioning member is secured to the circuit board by glue or solder.

13. The electronic device of claim 9, wherein the main body is located between the circuit board and the bottom plate.

14. The electronic device of claim 9, wherein the main body comprises two opposite side surfaces, the hook portions of the two latches extend towards each other and are located between the two opposite side surfaces, and a distance between the hook portions of the two latches is smaller than a distance between the two opposite side surfaces.

15. An electronic device comprising:
a chassis comprising a bottom plate, the bottom plate defining a through hole and two securing holes;
a circuit board located on the bottom plate in the chassis, a securing member and a positioning member secured to the circuit board, the positioning member contacting with the circuit board and the bottom plate, the positioning member defining a through opening and comprising a main body and two latches extending from a bottom surface of the main body; each latch comprising a hook portion, which is engaged in one of the two securing holes, the securing member defining a mounting hole; and
a fastening member comprising a head portion and a neck portion connected to the head portion, the neck portion locked in the mounting hole of the securing member, and the bottom plate located between the circuit board and the main body of the positioning member;
wherein the main body comprises two opposite side surfaces, and a distance between the hook portions of the two latches is smaller than a distance between the two opposite side surfaces.

16. The electronic device of claim 15, wherein the bottom plate is sandwiched between the bottom surface of the main body and the hook portion.

17. The electronic device of claim 16, wherein a slanted surface is located on the hook portion.

18. The electronic device of claim 16, wherein a diameter of the head portion is greater than that of the through hole of the bottom plate, and a diameter of the neck portion is smaller than that of the through hole.

19. The electronic device of claim 16, wherein the main body of the positioning member is clung to the circuit board.

20. The electronic device of claim 16, wherein the main body is located between the circuit board and the bottom plate.

* * * * *